United States Patent [19]

Beastall et al.

[11] Patent Number: 4,523,417
[45] Date of Patent: Jun. 18, 1985

[54] RADIANT ENERGY SHIELDED ENCLOSURES

[75] Inventors: William H. Beastall; Vernon R. Ballew; Richard D. Collier; John T. Bagby, all of Evansville, Ind.

[73] Assignee: International Steel Company, Evansvile, Ind.

[21] Appl. No.: 447,697

[22] Filed: Dec. 7, 1982

[51] Int. Cl.³ ............................................... E04B 1/00
[52] U.S. Cl. ......................................... 52/273; 52/280; 52/282; 52/584; 52/726
[58] Field of Search ................. 52/273, 222, 584, 282, 52/726, 280; 403/300, 306, 363

[56] References Cited

U.S. PATENT DOCUMENTS

| | | | |
|---|---|---|---|
| 2,263,510 | 11/1941 | Lindsay | 52/246 |
| 2,263,511 | 11/1941 | Lindsay | 52/222 |
| 2,838,592 | 6/1958 | Fekectics | 52/280 X |
| 2,905,283 | 9/1959 | Leach | 52/282 |
| 4,174,911 | 11/1979 | Maccario et al. | 52/726 X |
| 4,192,113 | 3/1980 | Martin, Jr. | 52/282 |

FOREIGN PATENT DOCUMENTS 635439  4/1950  United Kingdom ................ 403/306

Primary Examiner—Carl D. Friedman
Attorney, Agent, or Firm—Brady, O'Boyle & Gates

[57] ABSTRACT

To enable the ready transport and erection of radiant energy shielded enclosures at locations having various immovable obstructions, shielded joints of several different types each having shielded splices therein are provided for the connection in the enclosure of adjacent sheets occupying a common plane or two right angular planes. A compound joint at the intersection of three right angular planes occupied by sheets of the enclosure is also provided. The construction is applicable to future expansion of existing shielded enclosures without sacrifice of shielding performance at the interface of the addition with the existing portion.

8 Claims, 14 Drawing Figures

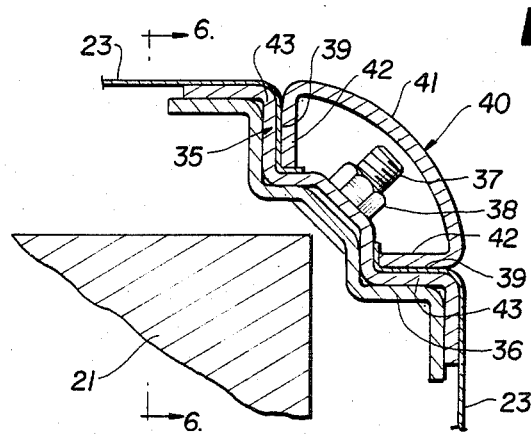
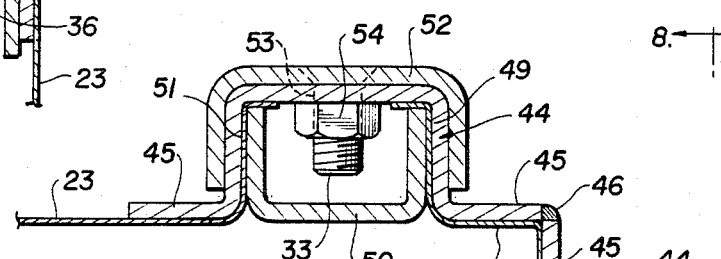
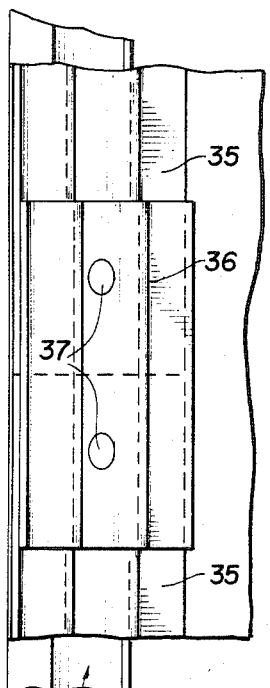
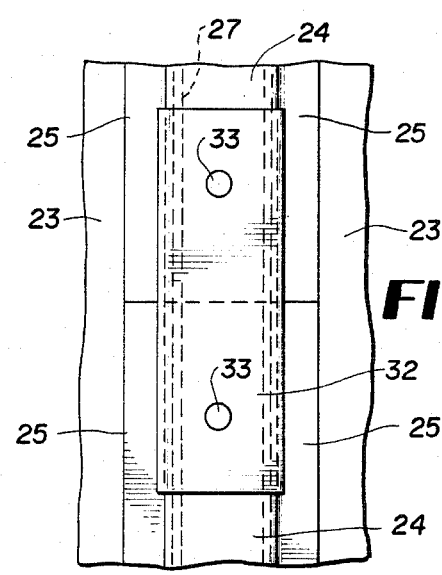
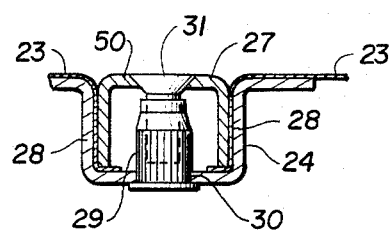
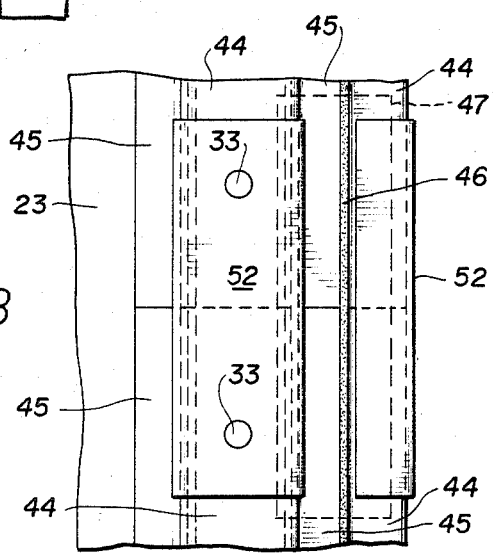
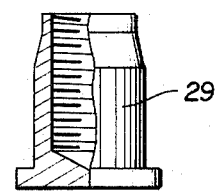

4,523,417

RADIANT ENERGY SHIELDED ENCLOSURES

BACKGROUND OF THE INVENTION

The general objective of this invention is to provide a radiant energy shielded enclosure of increased operational efficiency, greater versatility of construction, and greater practicality.

More particularly, the invention satisfies a need for a radiant energy shielded enclosure which can be constructed in a variety of configurations around existing immovable obstructions, such as columns, in buildings without sacrifice in shielding performance.

Another object is to provide a shielded enclosure which can be constructed as an addition or extension of an existing enclosure, without loss of shielding performance.

Still another object is to provide a shielded enclosure which can achieve a shielding rating of 100 decibels at 10 gigahertz.

Other features and advantages of the invention will be made apparent to those skilled in the art during the course of the following description.

BRIEF DESCRIPTION OF THE DRAWINGS

FIG. 4 is an enlarged fragmentary horizontal section taken on line 4—4 of FIG. 2.

FIG. 5 is an enlarged fragmentary vertical section taken on lines 5—5 in FIGS. 1 and 2.

FIG. 6 is an enlarged fragmentary elevational view taken on line 6—6 of FIG. 4.

FIG. 7 is a similar view taken on line 7—7 of FIG. 3.

FIG. 8 is a similar view taken on line 8—8 of FIG. 5.

FIG. 13 is a fragmentary vertical section taken through a tensioning element and associated parts on line 13—13 of FIG. 9.

FIG. 14 is a side elevation, partly in section, of a splined anchor nut for tensioning elements.

DETAILED DESCRIPTION

Figure 1:
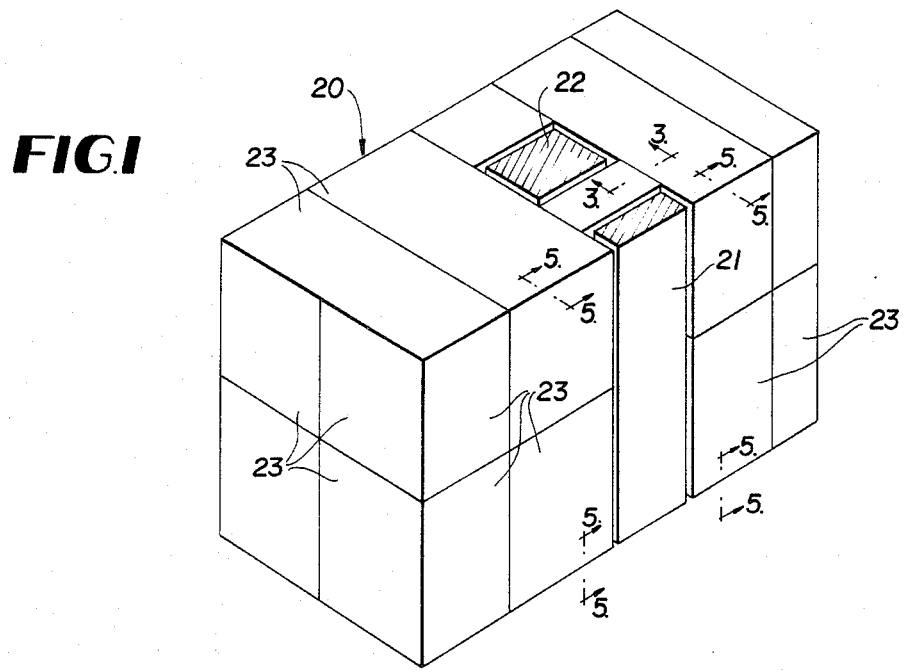
FIG. 1 is a schematic perspective view, partly in section, of a shielded enclosure erected around immovable obstructions in accordance with the invention.

Referring to the drawings in detail wherein like numerals designate like parts, FIG. 1 shows an enclosure of the Lindsay type constructed generally in accordance with U.S. Pat. Nos. 2,263,510; 2,263,511; and 2,364,083. While this type of enclosure is very well suited to accommodate the shielding means of the present invention, nevertheless the invention is not limited to use in a Lindsay enclosure or structure.

Figure 2:
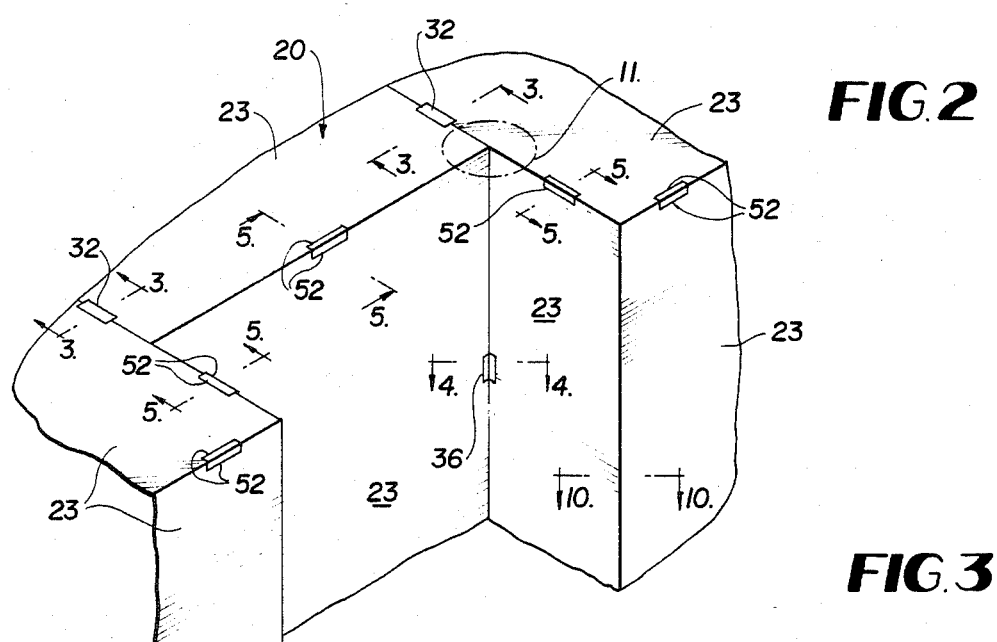
FIG. 2 is an enlarged fragmentary perspective view of a portion of the shielded enclosure in FIG. 1 erected around a rectangular cross section obstruction.

In FIGS. 1 and 2 of the drawings, a shielded enclosure 20 according to the invention is erected around two immovable obstructions 21 and 22 such as spaced building columns. The essence of the invention, to be described, lies in the formation of the various shielded corner joints and splices which enable the erection of the enclosure in the illustrated manner, without sacrifice in shielding performance and without greatly increased cost of construction.

The arrangement shown in FIGS. 1 and 2 is merely illustrative of one of many possible embodiments of the invention namely where two vertical building columns 21 and 22 are encountered. Utilizing the same essential components, now to be described, a shielded enclosure can be erected around other commonly found obstructions, such as horizontal beams, offset wall portions produced by closets, and the like. As previously explained, the invention finds utility in the construction of a totally new shielded enclosure or in an addition to an existing shielded enclosure without loss of shielding efficiency.

As shown in the Lindsay patents, the shielded enclosure 20 is constructed from a plurality of separately formed contiguous rectangular thin metal sheets 23 of various sizes. These sheets are joined along their meeting edges with adjacent sheets of the enclosure including along the various right angular corners in the structure. The essence of the invention resides in forming these joints between sheets in such a way that the resulting enclosure is highly effective in shielding radiant energy, as explained in the introductory portion of the application.

Figure 3:
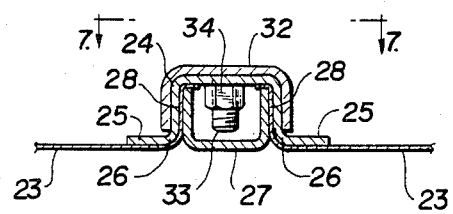
FIG. 3 is an enlarged fragmentary vertical section taken on lines 3—3 in FIGS. 1 and 2.

FIG. 3 shows a typical shielding joint between a pair of the sheets 23 which occupy a common plane in the enclosure, either horizontal or vertical. This joint comprises main channel members 24 which extend across any wall portion of the enclosure in end-to-end relationship and project exteriorly of such wall defined by the coplanar sheets 23. The main channel members 24 include opposite side flanges 25 which lie on the exterior faces of the sheets 23 and form rounded corners 26 with the body of the main channel around which edge portions of the sheets 23 are tensioned. Such tensioning or stretching is produced by an opposing tensioning channel 27 coextensive lengthwise with the main channel members 24 and fitting into the same snugly substantially as shown in the Lindsay patents. The corresponding edge portions 28 of the sheets 23 are held tightly in the narrow spaces between the two interfitting channels 24 and 27. The tensioning channel 27 has its closed side flush with the two interior faces of the sheets 23 to form a smooth interior surface for the shielding enclosure.

The tensioning channel 27 is firmly anchored at longitudinally spaced intervals by means best shown in FIGS. 13 and 14. This means consists of splined nuts 29 secured within spaced openings 30 of the main channel member 24, not shown in FIG. 3. Cooperative screws 31 are received in openings formed in the closed side of tensioning channel 27 and threadedly engage the nuts 29 within the space between the two interfitting channels.

Figure 12:
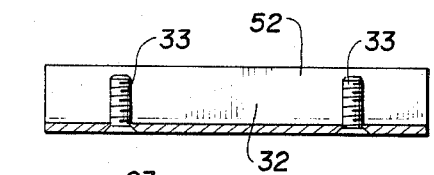
FIG. 12 is a vertical section taken through a splicing channel on line 12—12 of FIG. 9.

As shown in FIG. 7, a pair of the main channel members 24 utilized in the joint or connection of FIG. 3 are in end-to-end abutting relationship with the interior tensioning channel 27 bridging their abutting ends. A relatively short splicing channel 32, also shown in FIG. 3, is applied over the exterior of main channel members 24. As shown in FIG. 12, splicing channel 32 has spaced threaded studs 33 fixed thereto and these studs are engaged by nuts 34 within the space defined by the opposing channels 24 and 27. The nuts, as well as the threaded shanks of the studs 33, are concealed in the finished enclosure. The joint and splice thus formed is mechanically secure and efficient in shielding against radiant energy.

FIGS. 4 and 6 depict another necessary corner joint and splice for the enclosure depicted in FIGS. 1 and 2. This particular joint is formed by a required number of end-to-end abutting M-cross section members 35 bridged exteriorly by relatively short splicing members 36 of matching cross section. The bridging member or members 36 have spaced threaded studs 37 similar to the studs 33 secured thereto and receive nuts 38 interiorly of members 35.

An adjacent pair of perpendicular sheets 23 have corresponding edge portions 39 held and tensioned by a continuous tensioner 40 which extends longitudinally of the corner joint defining the interior thereof. The tensioner 40 has an interior arcuate wall 41 blending smoothly with the perpendicular sheets 23 and forming a rounded interior corner, and opposite side flanges 42 which engage between the adjacent parallel walls 43 of the M-cross section members 35. Again, a spliced joint for the enclosure at one or more corners thereof is formed in a mechanically secure manner with radiant energy shielding efficiency.

Figure 9:
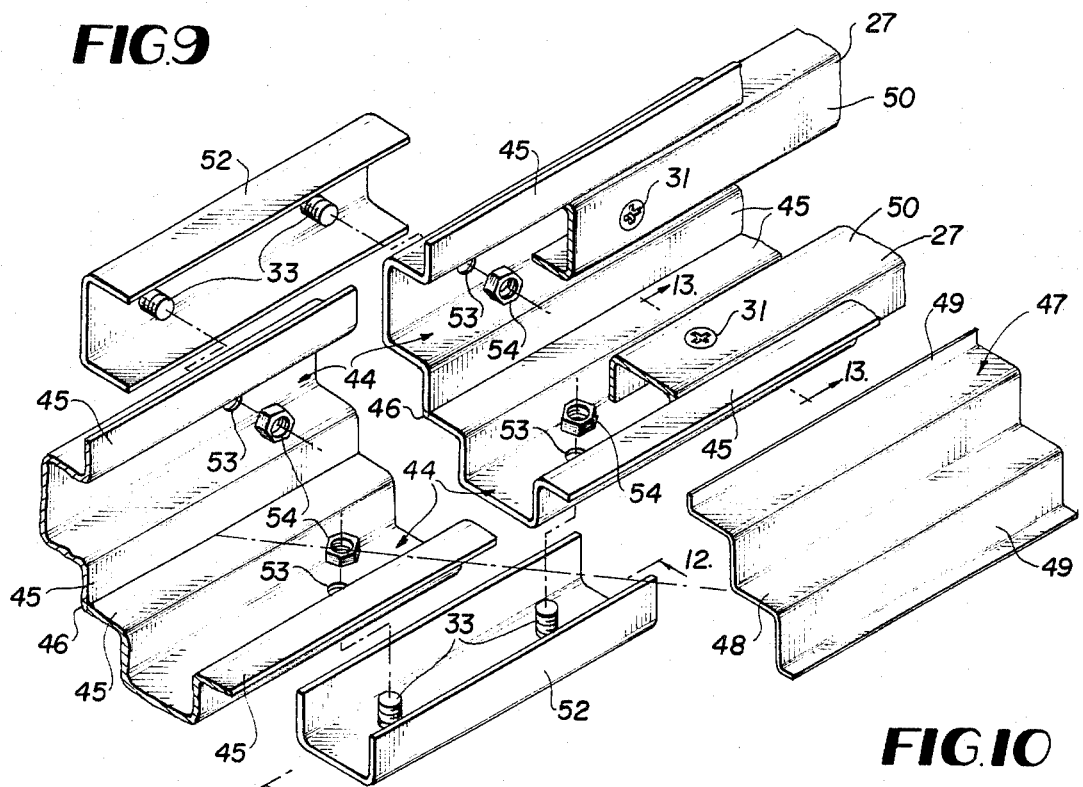
FIG. 9 is an exploded perspective view of a corner structure and splice utilized in the enclosure as depicted in FIGS. 5 and 8.

A further typical corner structure occurring at several places in the enclosure 20 is shown in FIGS. 5, 8 and 9. In these figures, a pair of perpendicular sheets 23 are shown. Also shown are two perpendicular main channels 44 having side flanges 45. As shown in FIG. 8, two or more channels 44 in end-to-end abutting relationship are utilized along the two sides of the dual joint and splice depicted. Adjacent perpendicular flanges 45 of the two main channels 44 are joined by a continuous longitudinal weld 46 which has no interruptions.

A single splicing sheet 47 includes a center right angular corner portion 48 which interfits with the two flanges 45 joined by the weld 46. Two identical edge portions 49 of the splicing sheet 47 are held between corresponding side walls of tensioning channels 50 and main channels 44. The tensioning channels 50 are continuous elements along the entire length of the dual joint and across its splice or splices necessitated by end-to-end abutment of the main channels 44. Single edge portions 51 of perpendicular sheets 23, FIG. 5, are held by the other side walls of tensioning channels 50 within the main channels 44.

As described previously in connection with the joint and splice shown in FIGS. 3 and 13, the tensioning channels 50 are secured at intervals along their lengths by the screws 31 engaging with the splined nuts 29 held in openings of the two main channels 44. Inasmuch as this arrangement is common to the forms of the invention shown in FIGS. 3 and 5, the reference numerals designating both of the tensioning channels 27 and 50 have been applied to the drawings in FIGS. 9 and 13 for clarification.

Comparatively short splicing channels 52, identical to the channels 32, are employed to form splices along the dual channel joint of FIGS. 5, 8 and 9 wherever the longitudinally welded main channels 44 meet in end-to-end abutment, as depicted in FIG. 8. The splicing channels 52 are equipped with the previously-described threaded studs 33 which pass through apertures 53 in main channels 44 and receive nuts 54 which bear against the undersides of the main channels 44, as best shown in FIG. 5. At the region of each splice thus formed, the splicing sheet which is common to the dual splice effectively shields the enclosure against the entry of radiant energy. The provision of the continuous weld 46 joining the two main channels 44 in right angular relationship eliminates the need for corner panels and corner caps used in the prior art. These prior art elements are troublesome in that they tend to lose tension over a period of time, resulting in reduced contact and reduced shielding performance compared to the weld 46.

It should be understood in the several forms of joints already described, namely the joints of FIGS. 3, 4 and 5, that the main channels or members 24, 35 and 44 of the enclosure are sectional members which abut end-to-end, thus requiring the described splices. However, the tensioning elements 27, 40, 50 are continuous in the sense that they bridge a number of the splices at the meeting points of the sectional main channels or members. Therefore, a cross sectional view taken through a joint of the enclosure, such as FIG. 10, in a plane on either side of a splice, will not include the splicing channels 52 and the cooperating splicing and shielding sheet 47.

Figure 11:
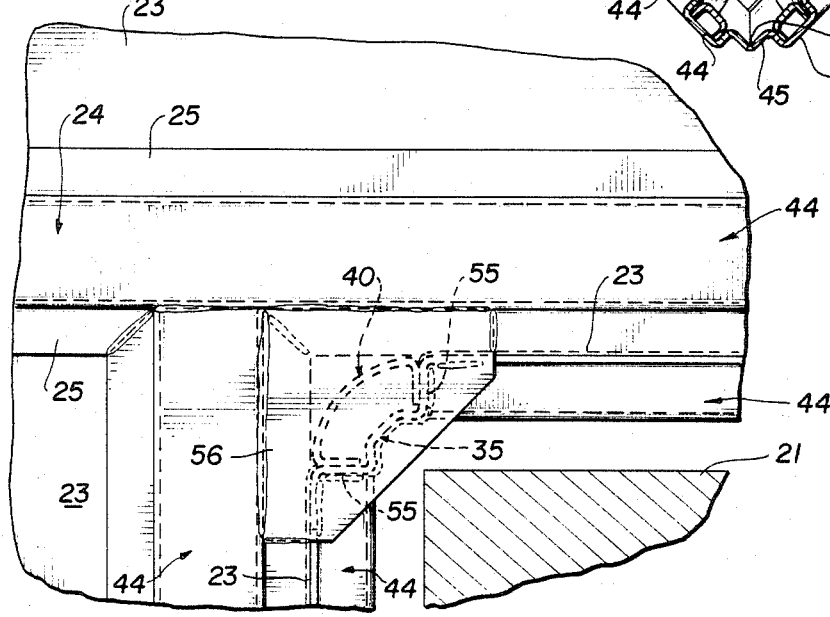
FIG. 11 is an enlarged fragmentary plan view of the area of the enclosure encircled at 11 in FIG. 2.

FIG. 11 depicts a further joint in the nature of a compound corner joint, necessitated along with the previously-described joints in the erection of shielded enclosures around various obstacles, as previously-discussed. In FIG. 11, an adjacent pair of the sheets 23 in a common plane are shown joined in enclosure shielding relationship by one of the simple joints illustrated in FIG. 3 at a region where there is no splice. Two additional sheets 23 at right angles to each other and also perpendicular to the common plane occupied by the other two sheets 23 in FIG. 11 are joined by one of the M-cross section members 35 described in FIG. 4 and a coacting continuous tensioner 40, also shown in FIG. 4.

Figure 10:
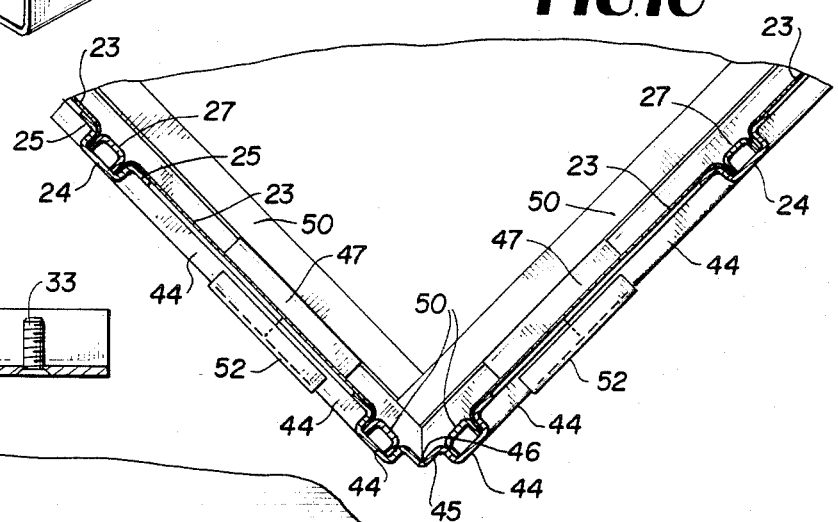
FIG. 10 is an enlarged fragmentary horizontal section taken on line 10—10 of FIG. 2.

Extending beyond the location of these elements 35 and 40 in FIG. 11 in right angular relationship around a corner of the obstruction 21 are two of the dual right angular joints of the types shown in FIGS. 5 and 10, in regions where there are no splices, and therefore no splicing channels 52 or sheets 47. The two connected pairs of main channels 44 as described in FIG. 5 are shown in FIG. 11, meeting at the right angular corner defined by the elements 35 and 40. Corresponding ends 55 of two of the channels 44 are butt welded to adjacent surfaces of the M-cross section member 35. A closure plate or gusset 56 overlies the end of the joint made up by the elements 35 and 40 and is welded into place around its margins, as shown. It may also be noted in FIG. 11 that the single channel 24 and one of the channels 44 of one dual channel joint are one and the same element. In essence, FIG. 11 depicts a compound corner connection for the shielded enclosure involving two of the double channel joints of FIG. 5 connected at right angles with a descending right angular joint of the kind shown in FIG. 4, and one of the single channel joints of FIG. 3 extending away from and being an extension of one dual channel joint 44—44.

In addition to enabling the construction of a completely shielded enclosure around various obstructions, the described splices formed in the several joints enables the making of separated sub-assemblies which are easily transportable to a required location where the enclosure can be erected in an expeditious manner. The unique advantages of the invention over the known prior art should now be readily apparent to those skilled in the art.

The terms and expressions which have been employed herein are used as terms of description and not of limitation, and there is no intention, in the use of such terms and expressions, of excluding any equivalents of the features shown and described or portions thereof but it is recognized that various modifications are possible within the scope of the invention claimed.

We claim:

1. In a radiant energy shielded enclosure of a type constructed from a plurality of taut metal sheets wherein some of the sheets occupy common planes on the enclosure and others occupy two right angular planes intersecting at corners of the enclosure, the enclosure further including compound corners formed by the intersections of sheets in a common plane with sheets in two right angular planes, and the two right angular planes also being perpendicular, the improvement comprising separable radiant energy shielding connections for the sheets of the enclosure in common planes, the sheets in right angular planes intersecting at corners and for the sheets intersecting at compound corners of the enclosure, each such connection comprising at least a main structural member extending longitudinally of the edge portions of adjacent sheets and a cooperative continuous sheet tensioner element interfitting with the main structural member and fixed thereto and binding the edge portions of the sheets between the fixed structural member and tensioner element, and radiant energy shielding splices at intervals along said connections where adjacent ends of sections of the main structural members are in abutment, and each splice including a relatively short splicing member engaging and interfitting with adjacent end portions of the main structural members and bridging the abutments of such members and being releasably secured to the main structural members of the enclosure, and the connections for sheets of the enclosure in common planes each comprising a main channel member, the legs of said main channel member having a pair of side longitudinal flanges along its length whereby the adjacent edge portions of sheets pass over the side flanges and enter the main channel member, and the continuous sheet tensioner element comprising an opposing channel element within the main channel member and engaging the edge portions of said sheets to bind them in the main channel member, releasable fastener means for the opposing channel elements within he main channel members, said releasable fastener means comprising splined nuts secured within spaced openings in the web portion of said main channel and cooperative screws received in openings formed in the web portion of the tensioning channel and threadably engaging said nuts within the space between the opposed channels, and each splice of the connection including a relatively short splicing channel member engaging over adjacent abutting end portions of sections of the main channel member, the web portion of the splicing channel member engaging the corresponding web portion of the main channel member, and the legs of the splicing channel member engaging the corresponding legs of the main channelmember substantially the full extent thereof, and separate releasable fasteners extending through the web portions of the main channel member and splicing channel member for interconnecting each short splicing channel with said abutting end portions of the sections of the main channel member, said separate releasable fasteners comprising at least a pair of threaded studs fixedly connected to the web Portion of said splicing channel member adjacent opposite ends thereof and extending inwardly of the splicing channel and extending through apertures in the web portions of the main channel members, said apertures being adjacent abutting end portions of said main channel members, and nuts within the space between the opposed channels engaging said threaded studs for tightly engaging the splicing channel member with said main channel members 2. In a radiant energy shielded enclosure of a type constructed from a plurality of taut metal sheets wherein some of the sheets occupy common planes on the enclosure and others occupy two right angular planes intersecting at corners of the enclosure, the enclosure further including compound corners formed by the intersections of sheets in a common plane with sheets in two right angular planes, and the two right angular planes also being perpendicular, the improvement comprising separable radiant energy shielding connections for the sheets of the enclosure in common planes, the sheets in right angular planes intersecting at corners and for the sheets intersecting at compound corners of the enclosure, each such connection comprising at least a main structural member extending longitudinally of the edge portions of adjacent sheets and a cooperative continuous sheet tensioner element interfitting with the main structural member and fixed thereto and binding the edge portions of the sheets between the fixed structural member and tensioner element, and radiant energy shielding splices at intervals along said connections where adjacent ends of sections of the main structural members are in abutment, and each splice including a relatively short splicing member engaging and interfitting with adjacent end portions of the main structural members and bridging the abutments of such members and being releasably secured to the main structural members of the enclosure, each connection for sheets of the enclosure disposed in right angular planes and intersecting at corners comprising at least a main structural member extending along the corner and common to the sheets intersecting at the corner, at least a continuous sheet tensioner element extending along the corner on one side of the main structural member and interfitting therewith, separable fastener means interconnecting the tensioner element and main structural member, and each splice of the connection comprising a short splicing member of matching cross sectional shape with the main structural member and interfitting therewith at the side of the main structural member away from said tensioner element and bridging end-to-end abutting sections of the main structural member, and additional separable fastener means interconnecting said splicing member and main structural member, the main structural member and the short splicing member having approximate M-cross sections including opposite side walls which are perpendicular to each other and to the adjacent sheets of the enclosure, and the continuous tensioner element having an arcuate wall between the secured edge portions of the sheets and a pair of converging side walls parallel to said opposite side walls of the main structural member and interfitting therewith to secure the edge portion of the sheets.

3. In a radiant energy shielded enclosure of a type constructed from a plurality of taut metal sheets wherein some of the sheets occupy common planes on the enclosure and others occupy two right angular planes intersecting at corners of the enclosure, the enclosure further including compound corners formed by the intersections of sheets in a common plane with sheets in two right angular planes, and the two right angular planes also being perpendicular, the improvement comprising separable radiant energy shielding connections for the sheets of the enclosure in common planes, the sheets in right angular planes intersecting at corners and for the sheets intersecting at compound corners of the enclosure, each such connection comprising at least a main structural member extending longitudinally of the edge portions of adjacent sheets and a cooperative continuous sheet tensioner element interfitting with the main structural member and fixed thereto and binidng the edge portions of the sheets between the fixed structural member and tensioner element, and radiant energy shielding splices at intervals along said connections where adjacent ends of sections of the main structural members are in abutment, and each splice including a relatively short splicing member engaging and interfitting with adjacent end portions of the main structural members and bridging the abutments of such members and being releasably secured to the main structural members of the enclosure, each connection for sheets of the enclosure disposed in right angular planes and intersecting at corners comprising at least a main structural member extending along the corner and common to the sheets intersecting at the corner, at least a continuous sheet tensioner element extending along the corner on one side of the main structural member and interfitting therewith, separable fastener means interconnecting the tensioner element and main structural member, and each splice of the connection comprising a short splicing member of matching cross sectional shape with the main structural member and interfitting therewith at the side of the main structural member away from said tensioner element and bridging end-to-end abutting sections of the main structural member, and additional separable fastener means interconnecting said splicing member and main structural member, the main structural member comprises a pair of main channels having side flanges and the side flanges of the main channels lying in two perpendicular planes and corresponding side flanges of thetwo main channels being continuously welded together along the intersection of the two planes, a pair of continuous tensioner channels opposing and interfitting within the two main channels and clamping single edge portions of the two adjacent sheets between side walls of the tensioner channels and main channels, and each splice comprising a formed splicing sheet lying on surfaces of the welded side flanges of the two main channels and having edge portions clampingly held between the other side walls of the tensioner channels and main channels, and a pair of relatively short splicing channels engaging over and bridging abutting end portions of sections of the two main channels at the sides thereof away from the tensioner channels, and separable fastener means interconnecting the main channels and the tensioner and splicing channels.

4. In a radiant energy shielded enclosure constructed from a plurality of taut metal sheets and having square corners defined by the intersections of perpendicular planes occupied by adjacent sheets, the improvement comprising a main structural member formed in end-to-end abutting sections along each corner of the enclosure, the main structural member including a pair of main channels having side flanges and the side flanges lying in the two perpendicular planes occupied by the sheets, corresponding adjacent side flanges of the main channels being connected by a continuous weld along the corner of the enclosure, a pair of sheet tensioner channels opposing and interfitting with the main channel and serving to secure single edge portions of the sheets along the corner of the enclosure between side walls of the tensioner channels and opposing side walls of the main channels, and radiant energy shielding splices in the main structural member adjacent to and bridging the abutments of the sections of the main structural members.

5. In a radiant energy shielded enclosure as defined by claim 4, and each splice comprising a splicing and shielding sheet lying on surfaces of the welded side flanges and on corresponding side walls of the two main channels and being clampingly held by the tensioner channels within the main channels, and a pair of relatively short splicing channels engaging over and bridging the abutments of sections of the two main channels at the sides thereof away from the tensioner channels, and separable fastener means serving to releasably connect the main channels with the tensioner and splicing channels.

6. In a radiant energy shielded enclosure as defined by claim 5, and the separable fastener means comprising fastener elements on each splicing channel engageable through spaced openings of the two main channels, cooperative releasable fastener elements engaging said fastener elements, additional fastener elements in spaced relationship on the main channels, and additional cooperative releasable fastener elements engageable through openings in the tensioner channels.

7. In a radiant energy shielded enclosure as defined in claim 5, and the splicing and shielding sheet having a stepped formation in cross section and comprising a center connected pair of perpendicular panels, an outer pair of perpendicular panels each one of which is perpendicular to one of the center pair of panels, and two relatively narrow end flanges on each of the outer pair of panels and substantially perpendicular thereto and extending beyond one face thereof, whereby said sheet can follow the cross sectional configuration of the two welded main channels.

8. In a radiant energy shielded enclosure as defined by claim 5, in which said splicing and shielding sheet is relatively short but greater in length than said short splicing channels.

* * * * *